United States Patent [19]

Daly

[11] Patent Number: 5,719,508
[45] Date of Patent: Feb. 17, 1998

[54] LOSS OF LOCK DETECTOR FOR MASTER TIMING GENERATOR

[75] Inventor: William George Daly, Duluth, Ga.

[73] Assignee: Northern Telecom, Ltd., Montreal, Canada

[21] Appl. No.: 595,583

[22] Filed: Feb. 1, 1996

[51] Int. Cl.$^6$ .................. H03L 7/097; H03D 3/24
[52] U.S. Cl. .................. 327/12; 327/2; 327/39; 327/150; 327/159; 327/156; 327/20; 331/DIG. 2; 331/25; 331/1 A
[58] Field of Search .................. 327/2, 20, 21, 327/147, 150, 156, 159, 141, 142, 24, 44, 39, 218, 407, 23, 12; 331/1 A, 25, DIG. 2

[56] References Cited

U.S. PATENT DOCUMENTS

| | | | |
|---|---|---|---|
| 4,613,777 | 9/1986 | Kible | 327/23 |
| 5,126,690 | 6/1992 | Bui et al. | 331/1 A |
| 5,159,279 | 10/1992 | Shenoi et al. | 327/2 |
| 5,278,520 | 1/1994 | Parker et al. | 331/1 A |
| 5,530,383 | 6/1996 | May | 327/147 |

Primary Examiner—Timothy P. Callahan
Assistant Examiner—Dinh T. Le
Attorney, Agent, or Firm—Foley & Lardner

[57] ABSTRACT

A digital loss of lock detection (LLD) device for a phase locked loop (PLL) generates a locked frequency signal synchronized with a reference frequency signal. The LLD comprises first to fifth latching means for detecting when the reference clock failed high/low, when the locked clock failed high/low and when the reference clock is outside the tracking range of the PLL. The first to fifth latching means provide respectively a first to fifth error signals for each type of the above faults.

12 Claims, 5 Drawing Sheets

LOSS OF LOCK DETECTOR FOR MASTER TIMING GENERATOR

BACKGROUND OF THE INVENTION

1. Field of the Invention

This invention relates generally to the field of clock holdover circuits for digital communication systems and, in particular, to a loss of lock detector for a phase locked loop.

2. Background Art

All digital communication systems require some degree of synchronization to incoming signals by the receivers. The basic level of synchronization required for coherent reception is the phase synchronization of the incoming signal with a locally generated carrier. At the heart of all phase synchronization systems is some version of a phase locked loop (PLL).

Phase locked loops are servo-controlled loops, whose control parameter is the phase of a locally generated replica of the incoming signal. PLLs have three basic components: a phase detector, a loop filter, and a voltage controlled oscillator (VCO).

The phase detector is a device that produces a measure of the difference in phase between the incoming signal and the local replica. As the incoming signal and the local replica change with respect to each other, the phase difference (or the phase error) becomes a time-varying signal. The phase detector generates an up control signal and a down control signal for the loop filter at the input of the VCO.

The loop filter governs the PLL's response to these variations in the error signal. The loop filter is generally a low pass filter for providing an error signal that is solely a function of the phase difference that is needed.

The VCO is the device that produces the carrier replica. The VCO is an oscillator whose frequency is controlled by a voltage level at the device input. The frequency of the output signal of the VCO is a monotonic function of its input voltage over some range of input and output. A positive input voltage (up control signal) will cause the VCO output frequency to increase, while a negative voltage (down control signal) will cause it to be less. Phase lock is achieved by feeding the filtered version of the phase difference between the incoming signal and the output of the VCO back to the input of the VCO. A well-designed loop should trace changes in the phase of the incoming signal, but not be overly responsive to receiver noise.

It is common for a PLL to lose phase lock should the input signal fade or jump to a different frequency of operation. When such a situation is detected, other system processing is suspended or modified until the PLL can re-establish phase lock.

Loss of lock detectors are typically accomplished in discrete implementation. The out-of-lock state is detected with loss of lock detection circuits (LLDs), which monitor the lock status of the PLL.

Some conventional lock detection schemes monitor the up control signal and the down control signal at the output of the phase detector to ascertain the lock status of the PLL. If the up control signal and down control signal are not pulsing, the loop node voltage remains substantially constant and the PLL should be in phase lock. When the up and down control signals are steadily generating pulses charging or discharging the loop filter to adjust the input voltage of the VCO, the loop must be in motion and thus out of phase lock.

Other known implementations of loss of lock detectors simply monitor the clock reference signal to determine when and if it degrades or is lost. A loss of lock signal may also be obtained by feeding the filtered output of the phase comparator (the VCO control voltage) into an analog window comparator. In these implementations, the lock signal goes high when the PLL is in a steady state phase and frequency lock condition, and goes low when the loop is out-of-phase.

Other prior art loss of lock circuits use the reference and the lock signals for determining the status of the PLL. Thus, U.S. Pat. No. 5,278,520 (Parker et al, issued Jan. 11, 1994) discloses a lock detection circuit for providing a lock detection signal when the reference and the lock signal have a first logic state at a first transition of a control signal, and a second logic state at a second logic transition. The lock detection signal must return to a valid state for a predetermined number of periods before the phase lock status indicates a valid lock condition. Since the device disclosed in the above-identified patent uses the state of the reference and locked signal and checks these states with a sample clock, additional circuitry is needed for obtaining a time slot on the reference clock signal.

Prior art lock sensors can generally be used for passive monitoring and evaluation, since the lock signal obtained with the current sensors is rather ambiguous. Thus, under certain conditions, the lock signal obtained with the prior art circuits may remain low even if the PLL is in phase lock condition. Therefore, the lock signal is not suitable to tell other active circuits whether to start using the clock generator signal.

However, processors used in digital communication systems need to synthesize one or more phase-locked frequencies from a reference clock. The reference clock can be a recovered frequency, or an internal flee-running clock. The processor requires a loss of lock signal (LOL) as part of selecting a suitable clock reference to be used as the timing generator reference.

In some processors, as for example in NT4F20AA, since the mixed signal ASICs were not developed, the only alternative is to seek an all digital detector to be implemented in one of several field programmable gate arrays of the processor. However, the field programmable gate array utilization of this processor is quite high, so that a simple implementation of the LLD is necessary.

In addition, when the clock signal is intended for the master timing generator (MTG) for a data processor, due to printed circuit board real estate constrains, a discrete implementation of this function is highly undesirable.

There is a need for an improved LLD circuit for a PLL which directly monitors the reference and the locked signals to determine the lock status of the PLL.

As well, there is a need for a LLD which is able to detect the occurrence of a phase lock condition at the output of the phase detector and provide a reliable phase lock signal to another circuit such as a microprocessor, for determining when and whether to start using the clock signal generated by the by the PLL clock driver circuit.

There is also a need for providing a simple implementation of the LLD so as to add to the existing circuits on the printed circuit board a minimal number of additional discrete components.

SUMMARY OF THE INVENTION

It is an object of the present invention to provide a LLD and method for PLL circuits, such as clock signal generator circuits and clock driver circuits, which gives a true and reliable phase lock indication so that an active circuit, such as a microprocessor, can use the lock signal to accept the PLL generated clock signal.

It is another object of the present invention to provide a digital LLD for use with a PLL which provides a true and reliable LOL signal, and is operative under various circumstances as, for example, when:

1) Either the reference clock or the synthesized clock is absent. This can come about either through the link being lost or through a failure of the internal dividers or clock references. The loss of lock detector needs to respond to both high and failed low conditions of the two clocks; and 2) The reference clock frequency is outside the capture range of the PLL.

Thus, the design for the present LLD tests the reference against the VCO and the VCO against the reference so that loss of lock due to missing clocks (either missing reference or failed VCO) are detected.

It is still another object of the present invention to provide an all-digital LLD which uses a reduced number of components and is implemented in one of the several field programmable gate arrays already present in the processor design. The device of the present invention does not require the additional circuitry to set up a timing window.

Still another object of the present invention is to provide a LLD with a simple design which is operable in a wide range of settings.

Briefly stated, the invention comprises a loss of lock detection circuit for a PLL where locked frequency lags the reference frequency by 90°. The alternate phase relationship is detected by swapping the reference and locked frequency inputs. Cases where frequency tracking without lock or significant phase wander within ±90° occur are not detected. Of course, the conventional analog detector has a similar limitation.

According to this invention, there is provided a digital loss of lock detection device for a phase locked loop (PLL) which generates a locked frequency signal synchronized with a reference frequency signal. The device comprises a first latching means for providing a first error signal when the reference frequency signal has a first logic level and the locked frequency signal transits from the first logic level to a second logic level. A second latching means gives a second error signal when the reference frequency signal has the second logic level and the locked frequency signal transits from the second logic level to the first logic level. A third latching means provides a third error signal to indicate when the locked frequency signal has the first logic level and the reference frequency signal transits from the second logic level to the first logic level.

As well, a fourth latching means gives a fourth error signal when said locked frequency signal has the second logic level and the reference frequency signal transits from the first logic level to the second logic level. The first to fourth error signals are ORed to obtain a loss of lock signal when any of the first to fourth error signals is in the first logic state. A reset signal initializes the latching means.

A fifth latching means may also be provided for latching the second error signal to give a fifth error signal to the OR gate upon detection of a phase error greater than ±90°.

There are two primary advantages of the present invention over prior art. First, there is no requirement for additional circuitry to generate secondary timing windows; the reference and common clocks are processed directly, thus greatly simplifying the detector. Secondly, the present invention tests both edges of the reference common clock against the locked common clock, and both edges of the locked common clock are tested against the reference common clock; thus, all failures of either the reference clock or the locked clock are detected.

BRIEF DESCRIPTION OF THE DRAWINGS

The foregoing and other objects, features and advantages of the invention will be apparent from the following more particular description of the preferred embodiments, as illustrated in the drawings.

DESCRIPTION OF THE PREFERRED EMBODIMENT

The Loss of Lock Detector of the present invention is designed for the NT4F20AA processor, but a similar design may be used for other processors.

The master timing generator used on the NT4F20AA synthesizes two phase-locked frequencies, 19.44 MHz and 12.352 Mhz, from a reference clock. The reference clock can be any one of three frequencies: 19.44 MHz recovered from the drawer link manchester encoded signal, 1.544 MHz recovered from the T1 link, or an internal 19.44 MHz free-running clock. The NT4F20AA processor requires a loss of lock signal as part of selecting a suitable clock reference to be used as the MTG reference.

Although there are four clock frequencies which need to be compared in the various configurations, the master timing generator divides any reference clock and both synthesized clocks to a common frequency, 8 KHz in this case. Therefore, the LLD can be simplified to test phase lock of the locked frequency and this reference common frequency. The LLD of the present invention responds to both failed high and low conditions of the reference and synthesized dock references, and also signals when the reference clock frequency is outside the capture range of the master timing generator (MTG).

Figure 1:
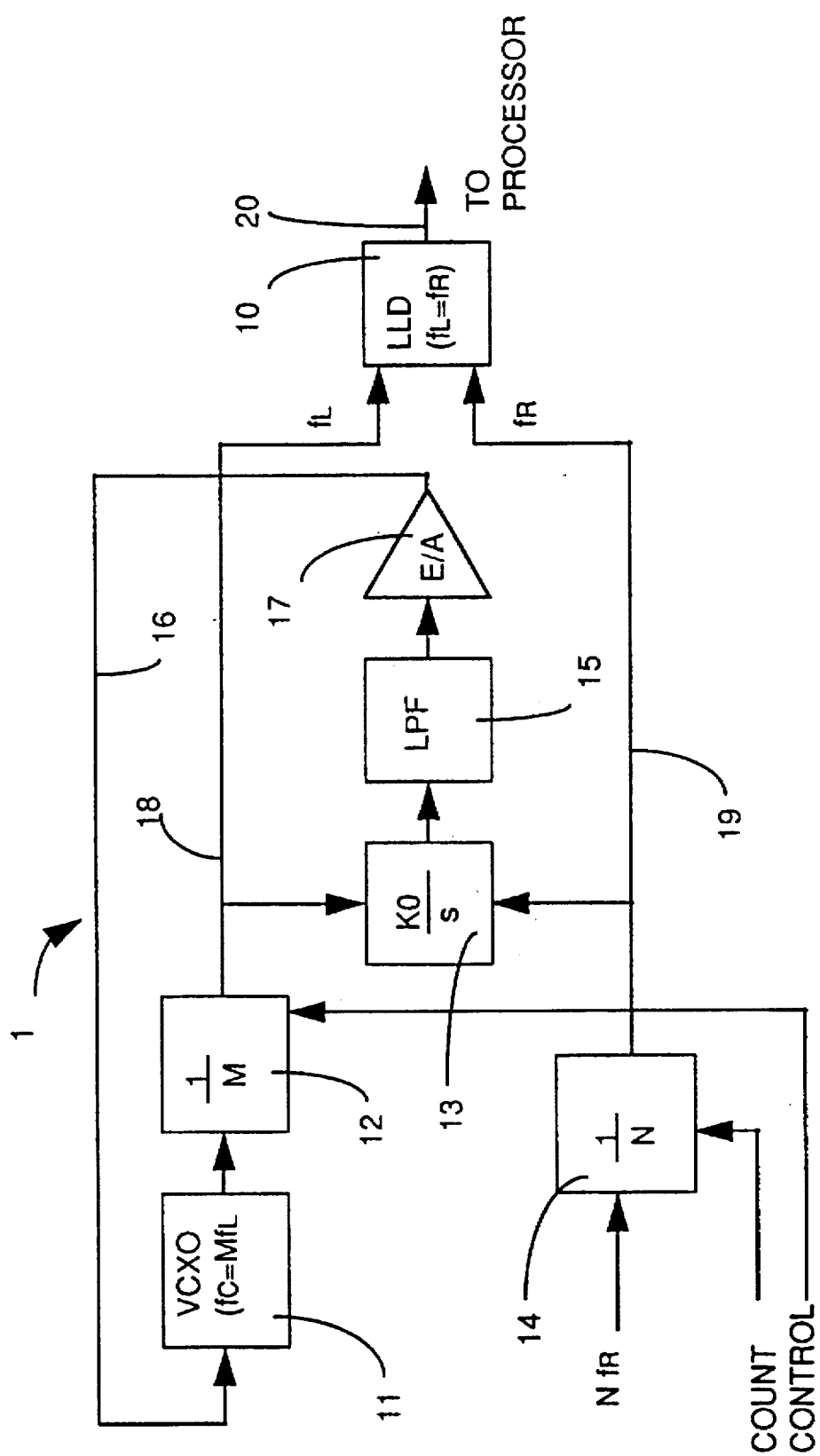
FIG. 1 is a block diagram of a Phase Locked Loop (PLL) with a Loss of Lock Detector (LLD) circuit according to the present invention.

FIG. 1 illustrates a phase locked loop, generally referred to by numeral 1, and the digital LLD of the present invention generally referred to by numeral 10.

The PLL circuit comprises the Voltage Controlled Oscillator (VCXO) 11 which generates the local frequency fC as a multiple of the locked frequency $f_L$. Divider 12 provides frequency $f_L$. This frequency is phase compared in block 13 with the reference frequency $f_R$ recovered after divider 12. The phase error output by comparator 13 is input to low pass filter 15 and then transformed into a voltage level 16 in amplifier 17, for controlling the frequency of oscillator 11.

The alternate phase relationship is detected in the LLD 10 by swapping the locked frequency and the reference frequency received on lines 18 and 19 respectively. The LOL signal is obtained at output 20. The diagram is repeated for the other synthesized clock; the two loss-of-lock signals are ORed, and sent to the processor.

Figure 2:
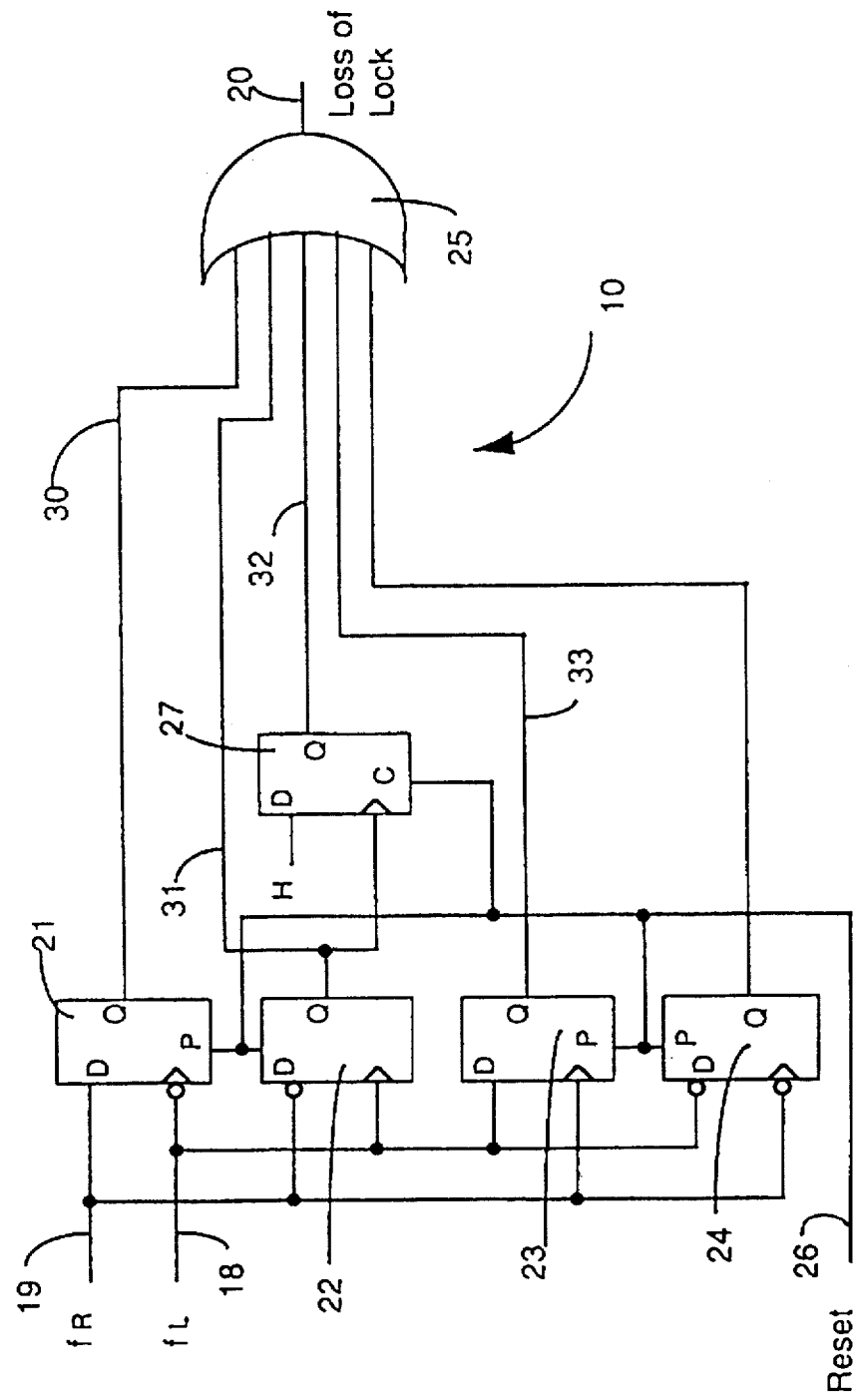
FIG. 2 is the logic circuit diagram of the LLD circuit.

FIG. 2 illustrates the logic circuit diagram of the LLD circuit 10. The five manifestations of the loss-of-lock detected by this circuit are:

1. reference clock failed high;
2. reference clock failed low;
3. locked clock failed high;
4. locked clock failed low; and
5. locked and reference clocks are active, but the reference clock is outside PLL tracking range or failed control section.

Each of these conditions is tested by flip-flops 21 to 24. The outputs of the flip-flops are connected to an OR circuit 25 and the loss of lock signal (LOL) is obtained at output 20.

A LOL=0 signal indicates that the locked frequency is tracking the reference frequency. The reset line 26 provides a reset signal to initialize the flip-flops and to cause LOL=1. A prerequisite of the LOL signal going low is that clock edges be present in the proper phase at the outset; this is the reason that the Q output of the flip-flop 22 bypasses flip-flop 27. Once this occurs, LOL=0 and the detector is initialized to begin testing clock presence and correct phase.

Flip-flops 21 to 24 are failed clock detectors. To reduce circuitry, the Q outputs of these flip-flops are not latched under the assumption that a lost clock signal would be a permanent condition. However, if there is cause to expect intermittent clocks, a scheme can be used where the outputs of the first to fourth flip-flops 21 to 24 are latched by fifth to eighth latching devices, respectively, just as is done for flip-flop 22.

Timing diagrams depicting these situations are shown in FIGS. 3 to 8 and therefore the description of FIG. 2 is being made together with the description of FIGS. 3 to 8, respectively.

Figure 3:
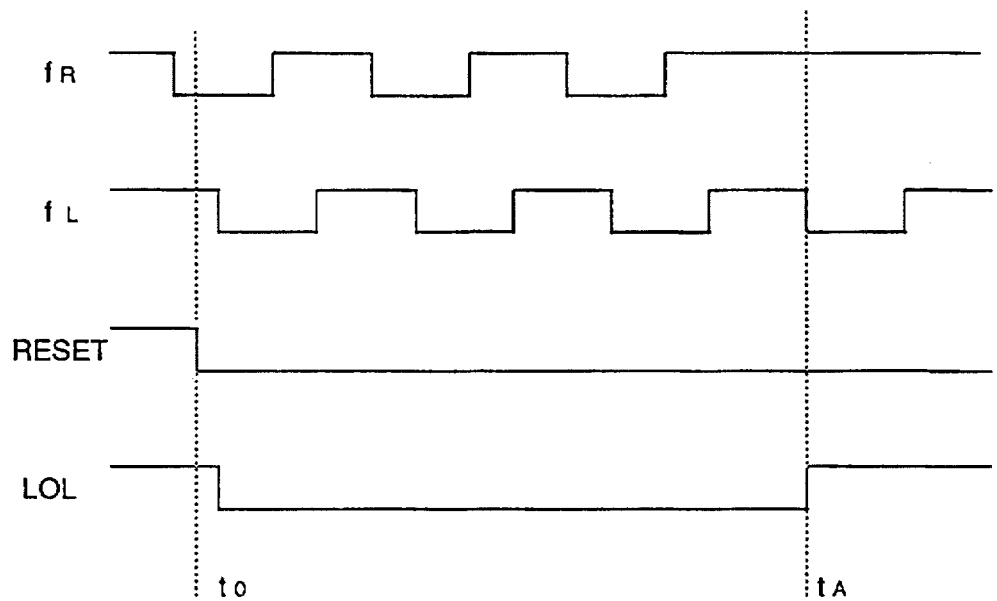
FIG. 3 is a timing diagram of the input and output signals for the LLD circuit, for the case when the reference clock fails high.

Depicted in FIG. 3 are the signals for an "output high" failure of the reference clock ($f_R$). An open circuit failure of the reference clock will also be detected since the reference clock output is pulled up in the master timing generator. When the reference and locked clocks are within 90° of the correct phase, the falling edge of the locked frequency clocks the low state of the reference frequency to the output of flip-flop 21, resulting in LOL=0. At time A, reference frequency failed high is detected by the falling edge of the locked frequency clocking the incorrect high state of the reference frequency to the output of flip-flop 25, signal 30 goes high, resulting in LOL=1.

Figure 4:
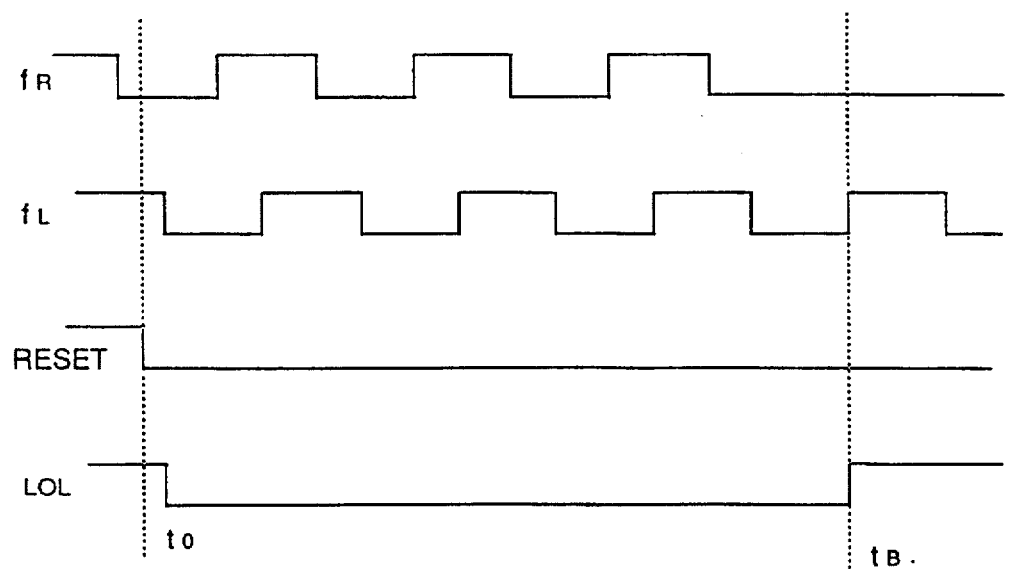
FIG. 4 is a timing diagram of the input and output signals for the LLD circuit, for the case when the reference clock fails low.

In FIG. 4, the signals for an "output low" failure of the reference clock ($f_R$) is shown. When the reference and the locked clocks are within 90° of the correct phase, the rising edge of the locked frequency clocks the "high state" of the reference frequency to the output of the flip-flop 22 resulting in LOL=0. At time B, the reference frequency failed low is detected by the rising edge of the locked frequency, clocking the incorrect "low state" of the reference frequency to the output of flip-flop 22, signal 31 goes high, resulting in LOL=1.

Figure 5:
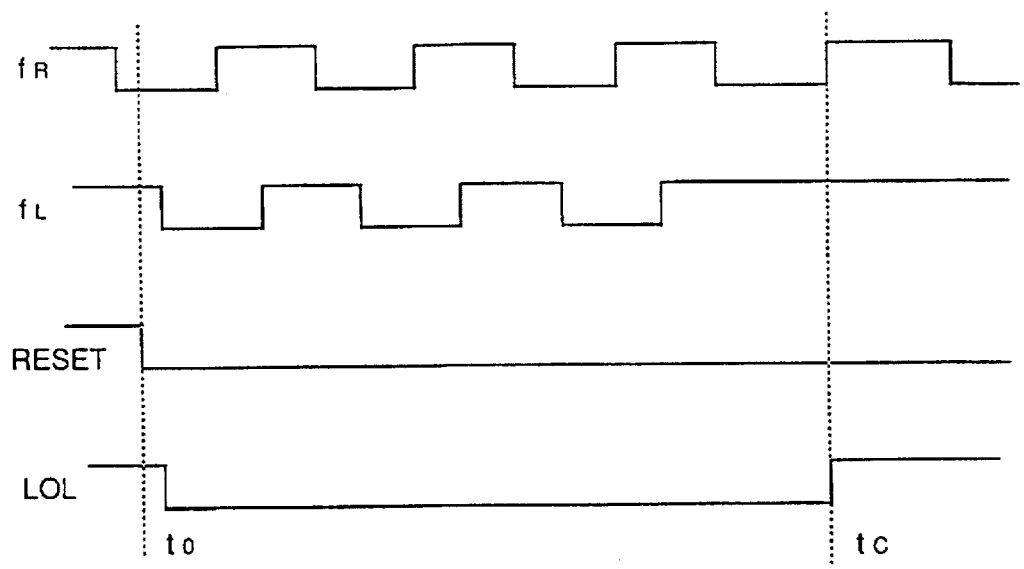
FIG. 5 is a timing diagram of the input and output signals for the LLD circuit, for the case when the locked clock fails high.

Depicted in FIG. 5 is the LLD signaling an "output high" failure of the locked clock ($f_L$). An open circuit failure of the locked clock will also be detected since the locked clock 11 (VCXO) output is pulled up in the master timing generator 1. When the reference and locked clocks are within 90° of the correct phase, the rising edge of the reference frequency clocks the low state of the locked frequency to the output of the flip-flop 23, resulting in LOL=0. At time C, the locked frequency failed high is detected by the rising edge of the reference frequency, clocking the incorrect high state of the locked frequency to the output of flip-flop 23, signal 33 goes high, resulting in LOL=1.

Figure 6:
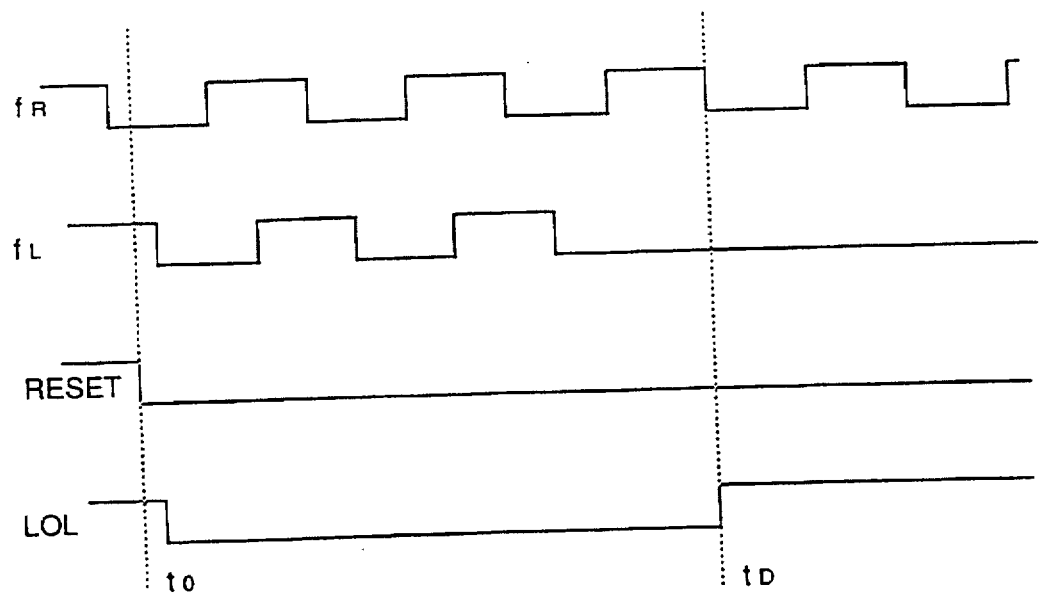
FIG. 6 is a timing diagram of the input and output signals for the LLD circuit, for the case when the locked clock fails low.

In FIG. 6, the LLD signals an "output low" failure of the locked clock ($f_L$). When the reference and locked clock are within 90° of the correct phase, the failing edge of the reference frequency clocks the "high state" of the locked frequency to the output of the flip-flop 24, resulting in LOL=0. At time D, the locked frequency failed low is detected by the falling edge of the reference frequency, clocking the incorrect "low state" of the locked frequency to the output of flip-flop 24, signal 34 goes high, resulting in LOL=1.

Figure 7:
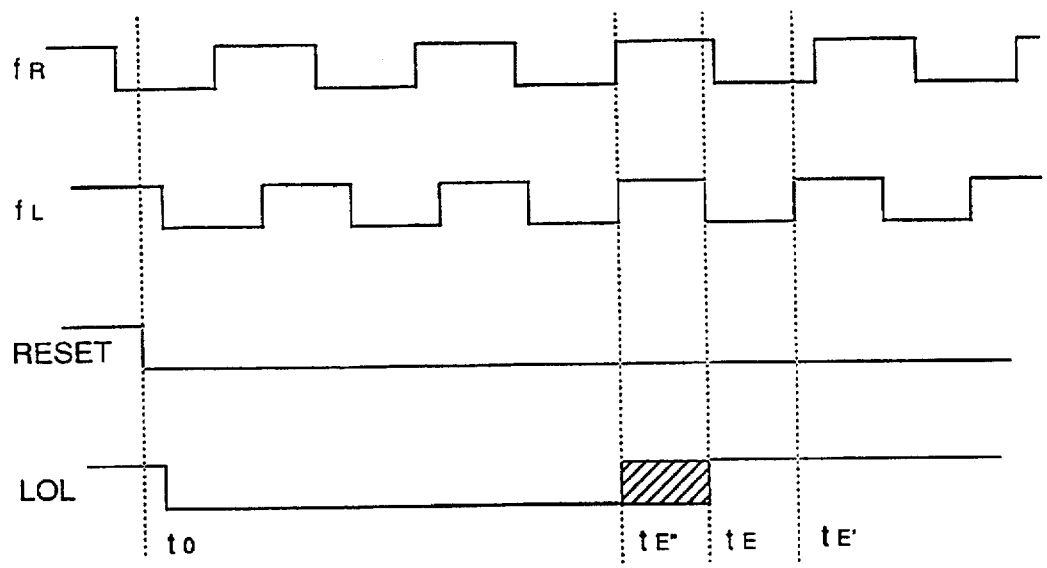
FIG. 7 is a timing diagram of the input and output signals for the LLD circuit, for the case when an error of phase higher than ±90° is detected.

FIG. 7 shows the situation where the master timing generator 1 is unable to capture the reference frequency clock, either due to an offset of the reference frequency or a failure of the MTG 1 circuitry. Strictly speaking, the ">90° phase error" term is only approximate, since the actual error is a frequency offset, namely a time varying phase. The detector circuit is necessarily asynchronous, thus an indeterminate state just prior to time E is possible. This is shown in FIG. 7 by the shaded area on the LOL signal. Whether the rising edge of the locked frequency clocks the incorrect low state of the reference frequency to the output of flip-flop 22 prior to time E is questionable. Assuming that detection is missed on the rising edge of the locked frequency just prior to time E, LOL=1 will nevertheless occur at time E in the same manner as shown in FIG. 3.

Without latching the LOL=1, signal 20 would alternate between 0 and 1, while the loop is out of lock, at a frequency and duty cycle dependent on the frequency difference between the reference frequency and the locked frequency. However, at time E', the latched LOL signal 32 is ORed with the initial LOL signal 31 by the rising edge of the locked frequency signal, clocking the incorrect "low state" of the reference frequency to the output 32 of flip-flop 27. A logic 1 is latched to the output of flip-flop 27 by the high going Q output of flip-flop 24, as shown at time B in FIG. 4.

Figure 8:
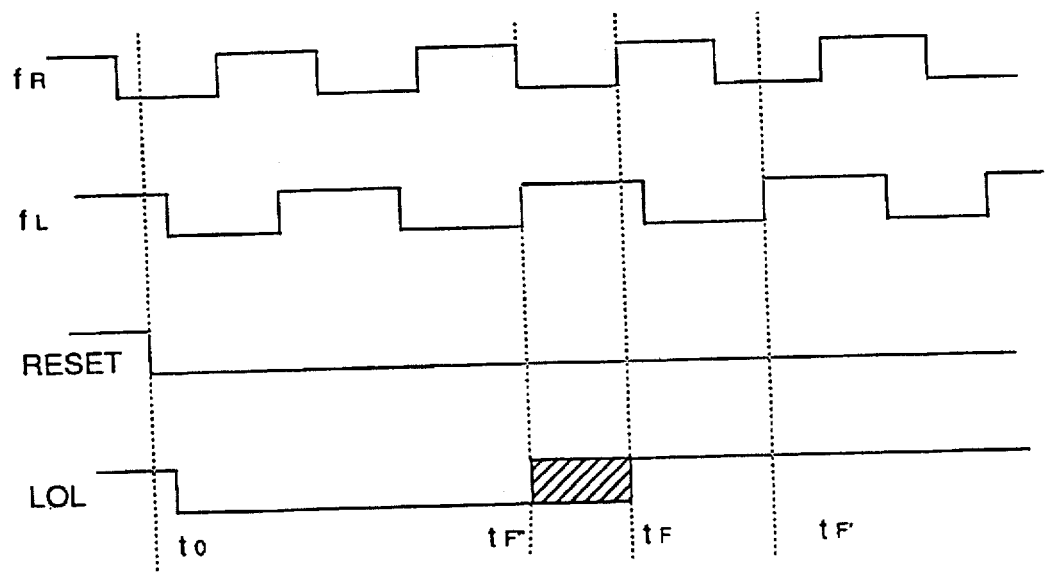
FIG. 8 is a timing diagram of the input and output signals for the LLD circuit, for the case when an error of phase higher than −90° is detected.

Operation of the LLD for negative phase error is shown in FIG. 8. The first indication of the loss of lock occurs on the rising edge of the reference frequency at time F in the same manner as shown at time C in FIG. 5. The rising edge of the reference frequency clocks the incorrect high state of the locked frequency to the output 33 of flip-flop 23. Beyond this initial detection, operation of the detector is identical to that shown in FIG. 7.

The above described latching of the LOL signal also occurs in the cases illustrated in FIG. 4, but is only necessary to the intent of the LLD shown in FIGS. 7 and 8.

While the invention has been described with reference to particular example embodiments, further modifications and improvements which will occur to those skilled in the art, may be made within the purview of the appended claims, without departing from the scope of the invention in its broader aspect.

What is claimed is:

1. A digital loss of lock detection device for a phase locked loop, comprising:

a plurality of latching devices for receiving a reference frequency signal representative of a reference frequency and for receiving a locked frequency signal representative of a locked frequency, said plurality of latching devices including, a first latching device for receiving said locked frequency signal and said reference frequency signal and for providing a first error signal when said reference frequency signal has a first logic level and said locked frequency signal transits from said first logic level to a second logic level;

a second latching device for receiving said locked frequency signal and said reference frequency signal and for providing a second error signal when said reference frequency signal has said second logic level and said locked frequency signal transits from said second logic level to said first logic level;

a third latching device for receiving said locked frequency signal and said reference frequency signal and for providing a third error signal when said locked frequency signal has said first logic level and said reference frequency signal transits from said second logic level to said first logic level; and a fourth latching device for receiving said locked frequency signal and said reference frequency signal and for providing a fourth error signal when said locked frequency signal has said second logic level aid said reference frequency signal transits from said first logic level to said second logic level, wherein each of said first error signal, said second error signal, said third error signal, and said fourth error signal indicates a loss of lock.

2. A device as claimed in claim 1 further comprising:

an OR gate for receiving said first to fourth error signals and providing a loss of lock signal when any of said first to fourth error signals is in said first logic state; and a reset device for providing a reset signal for initializing said first to fourth latching devices.

3. A device as claimed in claim 2 further comprising a fifth latching device for latching said second error signal and providing a fifth error signal to said OR gate upon detection of a phase error greater than ±90°.

4. A device as claimed in claim 2, wherein said first latching device comprises a first flip-flop connected to receive said reference frequency signal on a D input, said locked frequency signal on a clock input, and said reset signal on a P port and to output said first error signal on a Q output.

5. A device as claimed in claim 2, wherein said second latching device comprises a second flip-flop connected to receive said reference frequency signal on a D input, said locked frequency signal on a clock input, and said reset signal on a P port and to output said second error signal on a Q output.

6. A device as claimed in claim 2, wherein said third latching device comprises a third flip-flop connected to receive said locked frequency signal on a D input, said reference frequency signal on a clock input, and said reset signal on a P port and to output said third error signal on a Q output.

7. A device as claimed in claim 2, wherein said fourth latching device comprises a fourth flip-flop connected to receive said locked frequency signal on a D input, said reference frequency signal on a clock input, and said reset signal on a P port and to output said fourth error signal on a Q output.

8. A device as claimed in claim 3, wherein said fifth latching device comprises a fifth flip-flop connected to receive said second error signal on a clock input, said reset signal on a C port, and a clock signal (H) on a D input and to output said fifth error signal on a Q output.

9. A device as claimed in claim 1, further comprising fifth to eighth latching devices, each for latching a respective one of said first to fourth error signals.

10. A phase locked loop comprising:

a comparator for comparing a phase of a reference frequency signal with a locked frequency signal to generate a difference signal as a measure of a difference in phase between said reference frequency signal and said locked frequency signal;

a low pass filter for receiving said difference signal and providing a phase error voltage;

a voltage controlled oscillator for generating said locked frequency signal and adjusting said locked frequency signal according to said phase error voltage; and a loss of lock circuit for receiving said reference frequency signal and said locked frequency signal, monitoring said reference frequency signal, said locked frequency signal, and the phase difference between said reference frequency signal and said locked frequency signal, and generating a loss of lock signal when said phase locked loop is in one of a reference clock failed state, a locked clock failed state, and a phase error greater than 90° state, wherein said loss of lock circuit comprises a plurality of latching devices for receiving said reference frequency signal and said locked frequency signal and for generating an output signal indicating a loss of lock.

11. A method for detection of loss of lock state of a phase locked loop using a loss of lock detection device comprising a plurality of latching devices for generating a loss of lock signal, said phase locked loop generating a locked frequency signal synchronized with a reference frequency signal, comprising the steps of:

monitoring a phase difference between said reference frequency signal and said locked frequency signal;

detecting the failure state of said reference frequency signal when said locked frequency signal transits from a logic state to another;

detecting the failure state of said locked frequency signal when said reference frequency signal transits from a logic state to another; and detecting a phase error between said locked reference frequency signal and said locked frequency signal greater than ±90°.

12. A method for detecting loss of lock state of a phase locked loop using a loss of lock detection device comprising first to fourth latching devices for generating a loss of lock signal, said phase locked loop generating a locked frequency signal synchronized with a reference frequency signal, comprising the steps of:

providing a first error signal when said reference frequency signal has a first logic level and said locked frequency signal transits from said first logic level to a second logic level;

providing a second error signal when said reference frequency signal has said second logic level and said locked frequency signal transits from said second logic level to said first logic level;

providing a third error signal when said locked frequency signal has said first logic level and said reference frequency signal transits from said second logic level to said first logic level;

providing a fourth error signal when said locked frequency signal has said second logic level and said reference frequency signal transits from said first logic level to said second logic level;

providing a reset signal for initializing said first to fourth latching devices; and generating an out of lock signal from said first to fourth error signals.

* * * * *